US008839066B2

(12) United States Patent
Paranjape (10) Patent No.: US 8,839,066 B2
(45) Date of Patent: Sep. 16, 2014

(54) APPARATUS AND METHOD FOR OPTIMIZING AN ITERATIVE FEC DECODER

(75) Inventor: Prasad Paranjape, Fremont, CA (US)

(73) Assignee: Infinera Corporation, Sunnyvale, CA (US)

( * ) Notice: Subject to any disclaimer, the term of this patent is extended or adjusted under 35 U.S.C. 154(b) by 262 days.

(21) Appl. No.: 12/728,515

(22) Filed: Mar. 22, 2010

(65) Prior Publication Data

US 2011/0231729 A1 Sep. 22, 2011

(51) Int. Cl.
*H03M 13/00* (2006.01)

(52) U.S. Cl.
USPC .......................................... 714/752

(58) Field of Classification Search
USPC .......................... 714/752, E11.032
See application file for complete search history.

(56) References Cited

U.S. PATENT DOCUMENTS

| 7,073,117 | B1 * | 7/2006 | Ireland et al. | 714/786 |
| 7,570,671 | B2 * | 8/2009 | Perkins et al. | 370/535 |
| 2002/0178417 | A1 * | 11/2002 | Jacob et al. | 714/752 |
| 2004/0096213 | A1 * | 5/2004 | Perkins et al. | 398/27 |
| 2004/0237062 | A1 * | 11/2004 | Zeidman et al. | 717/100 |
| 2006/0008279 | A1 * | 1/2006 | Chiang et al. | 398/202 |
| 2007/0168830 | A1 * | 7/2007 | Shin et al. | 714/755 |
| 2008/0148133 | A1 * | 6/2008 | Duggan | 714/796 |
| 2008/0297192 | A1 * | 12/2008 | van Wageningen et al. | 326/26 |
| 2009/0049358 | A1 * | 2/2009 | Jalloul et al. | 714/752 |
| 2010/0080562 | A1 * | 4/2010 | Perkins et al. | 398/98 |
| 2011/0231725 | A1 * | 9/2011 | Gotman et al. | 714/748 |

* cited by examiner

*Primary Examiner* — Ajay Bhatia
*Assistant Examiner* — Thien D Nguyen
(74) *Attorney, Agent, or Firm* — David L. Soltz (57) ABSTRACT

Consistent the present disclosure, errored bits are inserted into a data stream, which is carried by an optical signal. The optical signal is transmitted over an optical link that may induce additional errors, i.e., add additional errored bits to the data stream. At the receive end, the optical signal is converted into a corresponding electrical signal that carries the data stream. The data stream is subject to forward error correction (FEC) decoding with an iterative decoder, for example. The iterative decoder decodes the data stream over a number of iterations until both the inserted errored bits and the additional errored bits are corrected. Since the number of inserted bits is known, the number of iterations required to correct the inserted bits is also known ("first iterations"). Accordingly, the number of iterations required to correct the additional errored bits caused by transmission over the optical link may be determined based on the total number of iterations performed and the number of the first iterations.

17 Claims, 5 Drawing Sheets

APPARATUS AND METHOD FOR OPTIMIZING AN ITERATIVE FEC DECODER

BACKGROUND OF THE INVENTION

Optical communication systems are known in which optical signals are modulated to carry data from a transmitter to a receiver over an optical link, such as an optical fiber. Various coding techniques, such as forward error correction (FEC), are known in which the transmitted data is encoded to include additional error correcting bits or syndromes. At the receiver, a decoder may be provided that decodes the encoded data and corrects errors that may have occurred during transmission based on the error correcting bits.

As data rates have increased, the number of bits to be decoded over a given period of time has also increased. Accordingly, many decoders have become increasingly complex and typically include a relatively high number of components, such as transistors or logic gates. Alternatively, a less complex iterative decoder may be provided that has fewer components. In such iterative decoders, data is decoded in a first iteration of the decoder, fed back to the input of the decoder, and decoded further by the decoder. This process may repeated, and, with each pass or iteration through the decoder, more errors are corrected. Preferably, however, the number of iterations performed by the decoder should be limited to a minimum in order to increase speed of the decoder.

Different optical links may require varying degrees of error correction. For example, certain fiber types may introduce less dispersion or other non-linear optical effects than others. Accordingly, depending on characteristics of the optical fiber and other system parameters, some optical communication systems may require more error correction than others. If such systems include an iterative decoder, the iterative decoder may perform fewer iterations if there are fewer errors to correct. On the other hand, if more errors are present, a higher number of iterations may be required.

Accordingly, there is a need to accurately identify an adequate number of iterations required to be performed by an iterative decoder to provide sufficient error correction.

SUMMARY

Consistent with the present disclosure, a method is provided that comprises generating a first errored data stream by inserting first errored bits into a first data stream. The method further includes transmitting a first optical signal over an optical link. The first optical signal carries the first errored data stream, and the transmission over the optical link causes second errored bits to occur in the transmitted first errored data stream, such that a first plurality of errored bits including the first and second errored bits are included in the first errored data stream. The method also includes performing a first plurality of iterations of forward error correction (FEC) decoding of the first errored data stream until the first plurality of errored bits are corrected. The method further includes determining a number of a second plurality of iterations of the FEC decoding to correct a second errored data stream that includes third errored bits but not the first errored bits. The third errored bits are caused by transmission of a second optical signal carrying the second errored data stream over the optical link. The step of determining the number of the second plurality of iterations being based, in part, on a number of the first plurality of iterations.

Consistent with an additional aspect of the present disclosure, an apparatus is provided that comprises a receiver circuit configured to receive a first optical signal supplied from an optical link. The first optical signal carries a first errored data stream, which includes a first plurality of errored bits. The first plurality of errored bits including first errored bits and second errored bits caused by propagation of the first optical signal over the optical link. The receiver circuit supplies an electrical signal that carries the errored data stream. The apparatus also includes an iterative decoder circuit coupled the receiver circuit. In response to the electrical signal, the iterative decoder circuit is configured to forward error correction (FEC) decode the first errored data stream over a first plurality of iterations until the first plurality of errored bits are corrected. A processor circuit is coupled to the iterative decoder and is configured to determine a number of a second plurality of iterations performed by the iterative decoder circuit to correct a second errored data stream that includes third errored bits but not the first errored bits. The third errored bits are caused by transmission of a second optical signal carrying the second errored data stream over the optical link. The number of the second plurality of iterations is determined based, in part, on a number of the first plurality of iterations.

It is to be understood that both the foregoing general description and the following detailed description are exemplary and explanatory only and are not restrictive of the invention, as claimed.

The accompanying drawings, which are incorporated in and constitute a part of this specification, and together with the description, serve to explain the principles of the present disclosure.

DESCRIPTION OF THE EMBODIMENTS

Consistent the present disclosure, errored bits are inserted into a data stream, which is carried by an optical signal. The optical signal is transmitted over an optical link that may induce additional errors, i.e., add additional errored bits to the data stream. At the receive end, the optical signal is converted into a corresponding electrical signal that carries the data stream. The data stream is subject to forward error correction (FEC) decoding with an iterative decoder, for example. The iterative decoder decodes the data stream over a number of iterations until both the inserted errored bits and the additional errored bits are corrected. Since the number of inserted bits is known, the number of iterations required to correct the inserted bits is also known ("first iterations"). Accordingly, the number of iterations required to correct the additional errored bits caused by transmission over the optical link may be determined based on the total number of iterations performed and the number of the first iterations. For example, the number of first iterations may be subtracted from the total number of iterations to obtain the number of iterations required to correct the additional errored bits. This process can be repeated for different numbers of inserted error bits, and the number of iterations required to correct the number of additional bits may be determined in each instance. An average number of iterations required to decode errored bits due to transmission over the optical link may thus be determined. The average is based on multiple measurements of the iteration number and may be more precise than if a single determination of the iteration number is made without the inserted errored bits. Accordingly, the number of iterations required to FEC decode a data stream transmitted in the absence of the inserted error bits can be accurately determined.

Reference will now be made in detail to the present embodiments, examples of which are illustrated in the accompanying drawings. Wherever possible, the same reference numbers will be used throughout the drawings to refer to the same or like parts.

Figure 1:
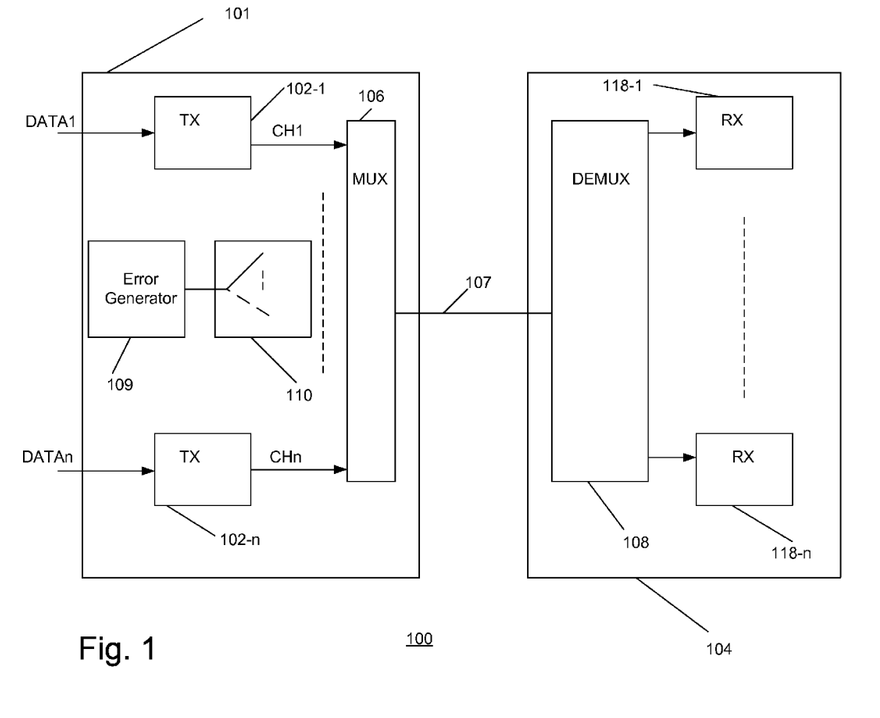
FIG. 1 illustrates a block diagram of a system consistent with the present disclosure.

FIG. 1 illustrates an example of an optical communication system 100 consistent with the present disclosure. System 100 includes a transmit node 101 having transmitters 102-1 to 102-n, each of which receiving a corresponding one of data streams DATA1 to DATAn and supplying a corresponding one of a plurality of optical signals or channels CH1 to CHn, for example. Each of optical channels CH1 to CHn has a corresponding one of a plurality of wavelengths. Multiplexer 106 combines optical channels CH1 to CHn into a wavelength division multiplexed (WDM) optical signal, which is supplied to optical path 107.

The WDM optical signal may be periodically amplified by optical amplifiers (not shown) provided along optical path 107 and supplied to receiver node 104. Receiver node 104 includes demultiplexer 108 that separates channels CH1 to CHn of the WDM optical signal and supplies each channel to a corresponding one of receiver circuits 118-1 to 118-n. In each receiver circuit 118-1 to 118-n, a corresponding one of channels CH1 to CHn is converted into an electrical signal, which is then subject to processing, as described below.

As further shown in FIG. 1, an error generator circuit 109 may be provided that selectively supplies control signals via switch 110 to one of transmitters 102-1 to 102-n at any given time. For example, at one instant in time, switch 110 may be configured to supply the control signal to transmitter 102-1, and, later, supply the control signals to transmitter 102-n. In one example, switch 110 is configured to successively supply the control signals to each of transmitters 102-1 to 102-n. As described in greater detail below, the control signals may be used to insert errored bits in a data stream output from each of transmitters 102-1 to 102-n.

Figure 2:
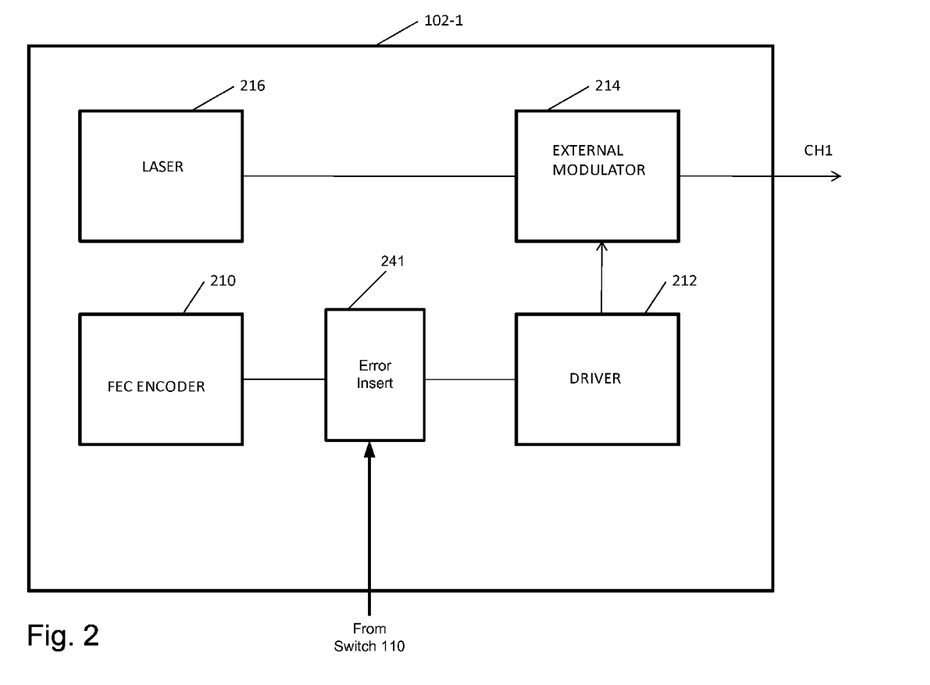
FIG. 2 illustrates an example of a transmitter consistent with the present disclosure.

FIG. 2 shows transmitter circuit 102-1 in greater detail. It is understood that transmitter circuits 102-2 to 102-N may have the same or similar structure as transmitter circuit 102-1. As shown in FIG. 2, data signal DATA1, in electrical form, is supplied to transmitter circuit 102-1 and fed to forward error correction (FEC) encoder circuit 210, which encodes the data signal in accordance with a known code, such as a Reed-Solomon code to generate a data stream. The encoded data is supplied to an error insertion circuit 241, which, under control of the control signals supplied by error generator 109, via switch 110, changes the values of selected bits output from FEC encoder circuit 210, to thereby supply an errored data stream. In one example, the control signals supplied by error generator 109 may constitute the inserted error bits.

The errored data stream is then fed to a known driver circuit 212, which supplies appropriate drive signals to an external modulator 214. External modulator 214, which may include a Mach-Zehnder interferometer, modulates the output of laser 216 in accordance with the drive signal to generate modulated channel CH1, which carries the errored data stream. Alternatively, external modulator 214 may include an electro-absorption modulator or another known external modulator. Moreover, laser 216 may be directly modulated with an appropriate drive signal, and, in that case, external modulator 214 may be omitted. Channel CH1 may be modulated in accordance with a variety of modulation formats, such as OOK, QAM, QPSK, DPSK, DQPSK, or duobinary. In addition, channel CH1 may have a first polarization, such as a TE polarization, and channel CH2 may have a second polarization, such as a TM polarization. It is understood that remaining transmitters 102-2 to 102-n may similarly operate to output errored data stream carried by channels CH2 to CHn, respectively.

As noted above, channels CH1 to CHn are supplied to receiver node 104 via optical path 107, which may include an optical link or fiber. The optical path 107 may induce additional errors into the errored data stream carried by channel CH1. CH1, along with the other channels, is demultiplexed by demultiplexer 108 and supplied to a corresponding one of receiver circuits 118-1 to 118-n, e.g., receiver circuit 118-1, which is shown in greater detail in FIG. 3. It is understood that remaining receiver circuits 118-2 and 118-N may have the same or similar structure as receiver circuit 118-1.

Figure 3:
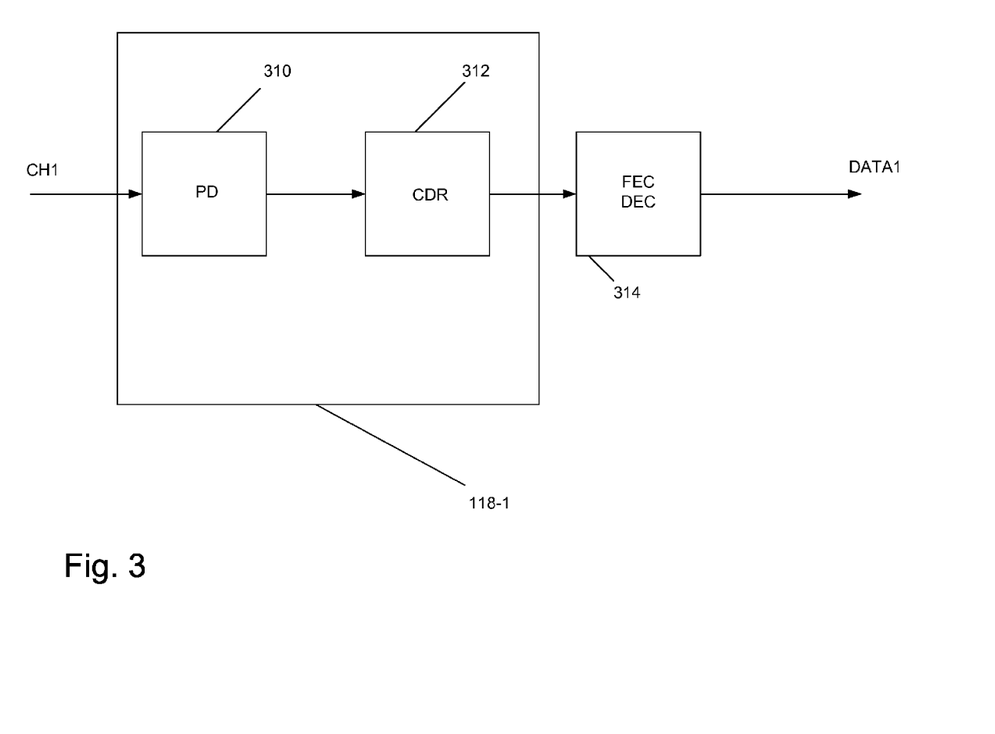
FIG. 3 illustrates an example of a receiver consistent with the present disclosure.

As shown in FIG. 3, receiver circuit 118-1 includes a photodetector, which receives a corresponding one of optical channels CH1 to CHn, which, in this example, is channel CH1. Photodetector 310 converts channel CH1 to a corresponding electrical signal, which is supplied to a known clock and data recovery circuit (CDR) 312. CDR 312, in turn in turn, supplies an output including the errored data stream to FEC decoder circuit 314. Typically, FEC decoder circuit 314 includes an iterative decoder which corrects errored bits (both the inserted errored bits and those occurring during transmission over optical path 107) included in the errored data stream and outputs a copy of the data stream DATA1 input to transmitter 102-1.

Figure 4:
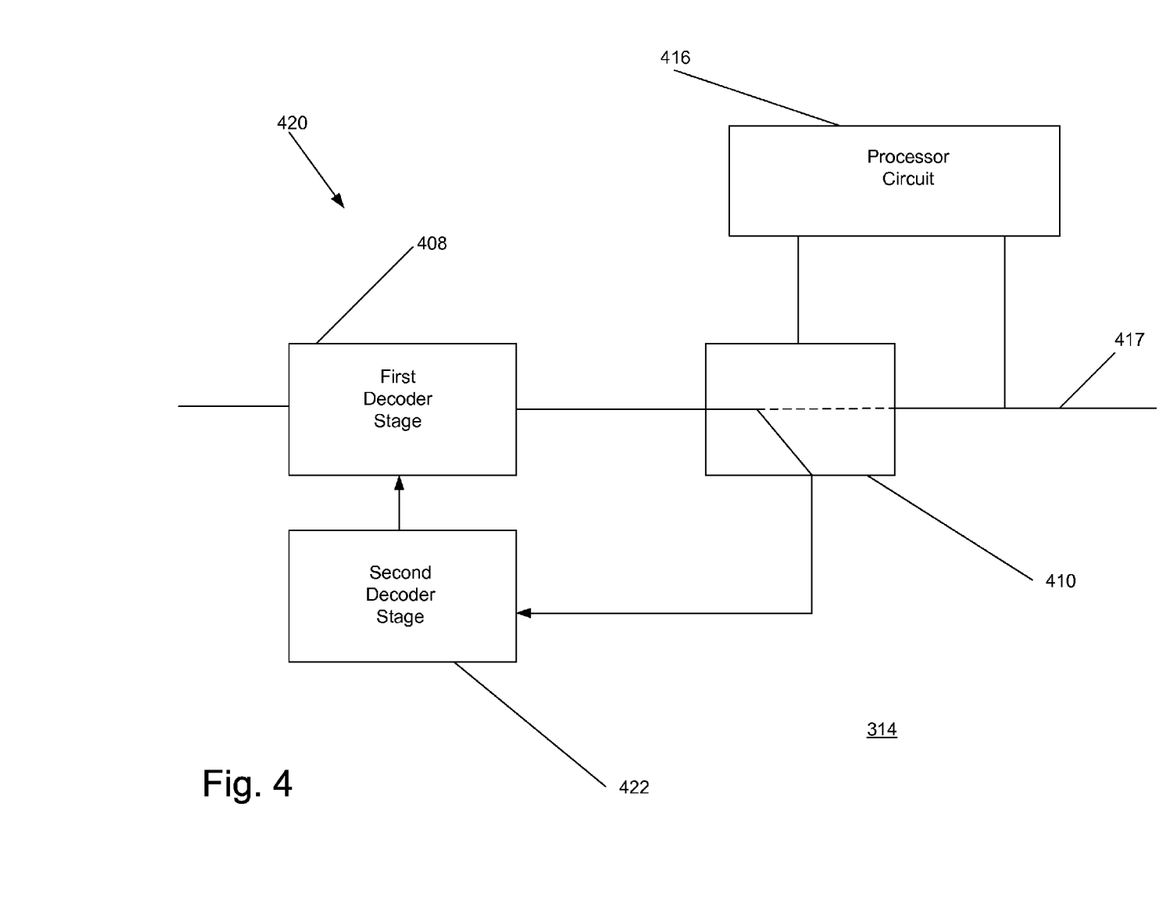
FIG. 4 illustrates an example of an iterative decoder circuit consistent with the present disclosure.

FIG. 4 illustrates decoder circuit 314 in greater detail. Decoder circuit 314 includes an iterative decoder circuit 420 having a first decoder stage 408 and a second decoder stage 422. First decoder stage 408 may decode a portion of the errored data stream received from clock and data recovery circuit 312 in accordance with a first forward error correction algorithm and supply a decoded output to switch 410. Processor circuit 416, in turn, may monitor a bit error rate (BER) or other parameter associated with the decoded output from first decoder stage 408 and, based on such monitored parameters, may control switch 410 to either direct the output from first decoder stage 408 to output line 417 or to second decoder stage 422 for further decoding. As further shown in FIG. 4, in the event switch 410 directs the output from first decoder stage 408 to second decoder stage 422, the errored data stream is further decoded by second stage 408, and then supplied again to first decoder stage 408 for additional decoding. The data stream is output again from first decoder stage 408, but with more errored bits corrected, thereby completing one FEC decoding iteration.

Figure 5:
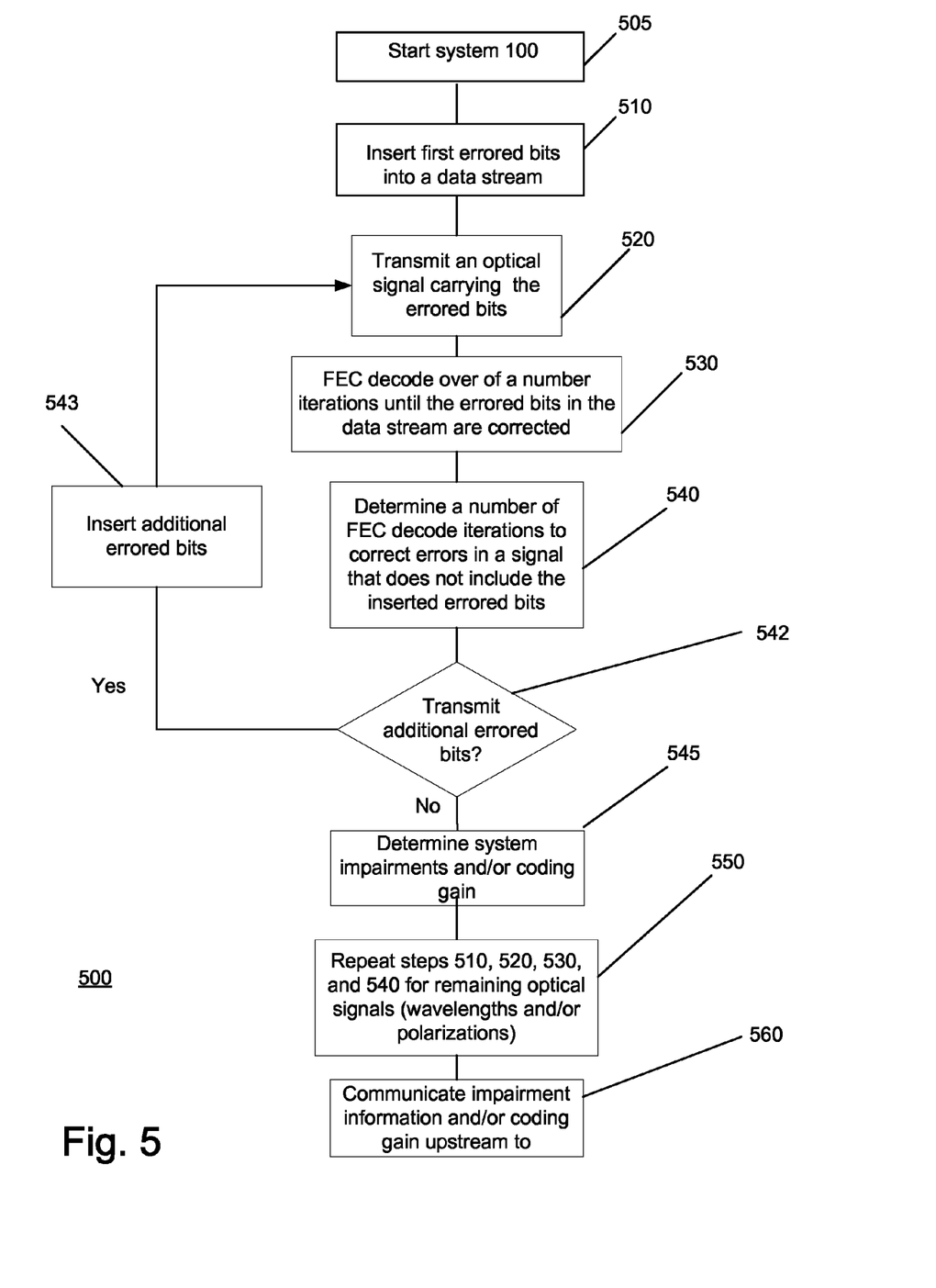
FIG. 5 illustrates a flowchart of an exemplary method consistent with the present disclosure.

As discussed in greater detail below with reference to flow chart 500 shown in FIG. 5, processor circuit 416 controls switch 410 to thereby control the number of FEC decoding iterations performed by iterative decoder 420.

Namely, flow chart 500 illustrates steps carried out in a method consistent with the present disclosure. In one example, this method may be carried out during start up (step 505) or booting up of system 100. In one step (step 510), first errored bits are inserted into a data stream by one of transmitters 102-1 to 102-n to provide an errored data stream. The optical transmitter (e.g., 102-1) then transmits an optical signal carrying the errored data stream to one of the receivers in receive node 104, such as receiver 118-1, via optical path or link 107 (step 520). As noted above, additional bit errors may occur during such transmission, such that a total number of bit errors present in the errored data stream is equal to a sum of the number of inserted errored bits in the transmitter plus the number of such additional errored bits occurring during transmission.

In step 530, the errored data stream is decoded by decoder circuit 314 over a number of iterations until the errored bits in the stream are corrected. For example, as noted above, processor circuit 416 may control switch 410 to feed back the output from first decoder stage 408 through the second decoder stage 422 to correct errored bits present the data stream. Switch 410 may be maintained to provide such feedback, e.g., cycling the data stream through the first (408) and second (422) decoder stages over a plurality of iterations, until the errored bits present in the data stream have been corrected.

Typically, as noted above, the total number of errored bits present in the errored data stream is equal to the number of inserted errored bits (first number) plus the number of additional errored bits (second number) occurring during transmission over optical path 107. Accordingly, the total number of FEC decode operations required to correct the total number of errored bits is equal to a first number of iterations required to correct a first number of bit errors and a second number of iterations required to correct a second number of bit errors equal. It is understood, however, that the first and second numbers of iterations may not equal the first and second numbers of bit errors, respectively.

The number of iterations required to correct a number of inserted bit errors is known, since the number of bit errors is known. Thus, processor circuit 416 may determine a number of iterations required to correct the additional bit errors by subtracting the number of iterations required to correct the inserted bit errors from the total number of iterations performed by iterative decoder 420 (step 540).

Optionally, different numbers of errored bits may be inserted into the data stream at transmitter 102-1 over subsequent time periods. Accordingly, a determination may be made as to whether additional errored bits should be transmitted (step 542). For example, if a desired number of iteration determinations are to be performed, a counter may be provided in order to determine whether a current number of iteration determinations exceeds the desired number of iteration determinations. If not, additional errored bits are inserted into a the data stream (step 543), and steps 510, 520, and 530 may be repeated by processor 416 for each grouping of additional errored bits. On the other hand, if the number of iteration determinations has exceeded the desired number of iterations (step 542), the method proceeds to step 545, which is discussed in greater detail below.

Accordingly, a number of iterations required to correct the additional errored bits occurring during each transmission may be determined. As a result, an average number of such iterations may be determined by processor circuit 416, which is based on multiple determinations of the iteration number. The average, therefore, may be more precise than if a single determination of the iteration number is made without the inserted errored bits. As a result, processor circuit 416 determines a number of FEC decode iterations to correct errors in a data stream that does not include the inserted errored bits. Such a data stream may typically be transmitted in system 100 under normal operating conditions.

In addition, as generally understood, by correcting bit errors, the transmitted signal may be considered as having an additional gain. Such gain is often referred to as a "coding gain," and, in the present example, the number of iterations determined in step 540 may also be used to calculate or determine an appropriate coding gain in system 100 (step 545). In a similar fashion, the number of iterations calculated in step 540 may optionally be used to quantify one or more impairments in system 100 (step 545), such as: loss along optical path 107, an optical signal-to-noise-ratio (OSNR), bit error rate (BER), chromatic dispersion, and polarization mode dispersion.

As noted above, the optical signal output from transmitter 102-1 typically has a particular wavelength, and optical signals output from remaining transmitters 102-2 to 102-n have wavelengths different from that of the optical signal output from transmitter 102-1 as well as from each other. Alternatively, selected optical signals output from transmitters 102-1 to 102-n may combine light having different polarizations. As shown in FIG. 5, steps 510, 520, 530, 540, 542, and 545 may be repeated for each optical signal supplied from remaining transmitters 102-2 to 102-n so that a number of iterations to correct errored bits occurring during transmission over optical path 107 may be determined for each optical signal wavelength or each polarization (e.g., TE and TM) (Step 550). Based on such information system impairments and/or coding gain for each wavelength and/or polarization may also be determined. As further noted above, switch 110 selectively supplies the control signals or errored bits for insertion into the data streams output from each transmitter 102-2 to 102-n so that steps 510, 520, 530, 540, 542, and 545 may be carried out for each wavelength and/or polarization.

In step 560, system impairment and/or coding gain information may be supplied to transmit node 101 via out-of band signaling, e.g., an optical service channel, as described in U.S. patent application Ser. No. 12/239,896, filed Sep. 29, 2009, for "Degradation Adaptation Network," the entire contents of which are incorporated herein by reference. Alternatively, in-band signaling may be employed to provide the impairment and/or coding gain information to transmit node 101. Based on such information, various components with transmit node 101 may be adjusted or controlled. For example, a number of error correcting bits transmitted on optical path 107 may be increased in order to achieve a higher coding gain.

It is noted that the method discussed above in connection with flowchart 500 may be carried out periodically while system 100 remains operational, and not at start up only. Accordingly, consistent with an additional aspect of the present disclosure, system impairments may be monitored over time. Moreover, an iterative decoder may decode over an optimized number of iterations at start-up as well as over the life of the system.

Other embodiments will be apparent to those skilled in the art from consideration of the specification and practice of the present disclosure. It is intended that the specification and examples be considered as exemplary only, with a true scope and spirit of the invention being indicated by the following claims.

What is claimed is:

1. A method, comprising:
   generating control signals;
   selecting one of a plurality of transmitters and supplying control signals to the selected one of the plurality of transmitters;
   encoding a series of bits to provide an encoded data stream;
   receiving the encoded data stream with said selected one of the plurality of transmitters;
   changing, in response to the control signals, a group of bits in the received encoded data stream to provide a first errored data stream, the changed group of bits being first errored bits;

transmitting, with said selected one of the plurality of transmitters, a first optical signal over an optical link, the first optical signal carrying the first errored data stream, the transmission of the first optical signal over the optical link causing second errored bits to occur in the transmitted first errored data stream, such that the first and second errored bits are carried by the first optical signal;

performing a first plurality of iterations of forward error correction (FEC) decoding of the first errored data stream until the first plurality of errored bits are corrected;

transmitting a second optical signal carrying third errored bits, but not the first errored bits, the third errored bits being caused by the transmission of the second optical signal over the optical link; and determining a number of a second plurality of iterations of the FEC decoding to correct the third errored bits, said determining being based, in part, on a number of the first plurality of iterations.

2. A method in accordance with claim 1, further including: generating the optical signal by modulating an output of a laser.

3. A method in accordance with claim 1, wherein the optical signal has one of a TE and a TM polarization.

4. A method in accordance with claim 1, wherein first iterations of the first plurality of iterations correct first bits of the plurality of errored bits, and second iterations of the first plurality of iterations second bits of the plurality of errored bits, a number of the first bits of the plurality of errored bits being substantially equal to a number of the first errored bits and a number of the second bits of the plurality of errored bits being substantially equal to a number of the second errored bits.

5. A method in accordance with claim 4, further including: determining the number of the second iterations of the first plurality of iterations based on the number of the first plurality of iterations and a number of the first iterations of the plurality of iterations, the number of the second iterations of the first plurality of iterations being substantially equal to the number of the second plurality of iterations.

6. A method in accordance with claim 5, wherein said determining the number of the second iterations of the plurality of iterations includes subtracting the number of first iterations of the plurality of iterations from the number of the plurality of iterations.

7. A method in accordance with claim 1, wherein the first and second optical signals having the same wavelength.

8. An apparatus, comprising:
a forward error correction (FEC) encoder that supplies a plurality encoded bits;
a switch that selects and supplies control signals to a first transmitter among a plurality of transmitters, the first transmitter including a circuit that receives the plurality of encoded bits and changes a group of bits in the received plurality of encoded bits in response to the control signals, the group of bits being first errored bits;
the first transmitter supplying a first optical signal to an optical link, the first optical signal carrying the first errored bits;
a receiver circuit configured to receive the first optical signal supplied from the optical link, the first optical signal carrying a first errored data stream, the first errored data stream including a first plurality of errored bits, the first plurality of errored bits including the first errored bits and second errored bits caused by propagation of the first optical signal over the optical link, the receiver circuit supplying an electrical signal carrying the errored data stream;

an iterative decoder circuit coupled the receiver circuit, such that, in response to the electrical signal, the iterative decoder circuit being configured to forward error correction (FEC) decode the first errored data stream over a first plurality of iterations until the first plurality of errored bits are corrected;

a processor circuit coupled to the iterative decoder, the processor circuit being configured to determine a number of a second plurality of iterations performed by the iterative decoder circuit to correct third errored bits, the third errored bits being included in a plurality of bits carried by a second optical signal, the plurality of bits carried by the second optical signal not including the first errored bits, the third errored bits being caused by transmission of the second optical signal over the optical link, said determining being based, in part, on a number of the first plurality of iterations.

9. An apparatus in accordance with claim 8, wherein first iterations of the first plurality of iterations correct first bits of the plurality of errored bits, and second iterations of the first plurality of iterations correct second ones of the plurality of errored bits, a number of the first bits of the plurality of errored bits being substantially equal to a number of the first errored bits and a number of the second bits of the plurality of errored bits being substantially equal to a number of the second errored bits.

10. An apparatus in accordance with claim 9, wherein the processor circuit is further configured to determine the number of the second iterations of the first plurality of iterations based on the number of the first plurality of iterations and a number of the first iterations of the plurality of iterations, the number of the second iterations of the first plurality of iterations being substantially equal to the number of the second plurality of iterations.

11. An apparatus in accordance with claim 10, wherein the processor circuit is further configured to determine the number of the second iterations of the plurality of iterations includes subtracting the number of first iterations of the plurality of iterations from the number of the plurality of iterations.

12. An apparatus in accordance with claim 8, wherein the receiver circuit is a first receiver circuit, and the iterative decoder circuit is a first iterative decoder circuit, and the electrical signal is a first electrical signal, the apparatus further including:
a second receiver circuit configured to receive a third optical signal supplied from the optical link, the third optical signal carrying a third errored data stream, and generate a second electrical signal carrying the third errored data stream; and
a second iterative decoder circuit coupled the second receiver circuit, such that, in response to the second electrical signal, the iterative decoder circuit being configured to forward error correction (FEC) decode the third errored data stream over a second plurality of iterations.

13. An apparatus in accordance with claim 12, wherein the first and second optical signals have a first wavelength, and the third optical signal has a second wavelength different than the first wavelength.

14. An apparatus in accordance with claim 8, further including:
- a first laser and a first modulator provided in the first transmitter, the first modulator supplying the first optical signal in response to a first optical output from the first laser; and
- a second laser and a second modulator provided in another one of the plurality of transmitters, the second modulator supplying the third optical signal in response to a second optical output from the second laser.

15. An apparatus in accordance with claim 14, further including:
- an optical multiplexer configured to receive the first and third optical signals and combine the first and third optical signals onto the optical link.

16. An apparatus in accordance with 15, wherein the optical link includes an optical fiber.

17. An apparatus in accordance with claim 13, further including an optical demultiplexer having first and second outputs, the optical demultiplexer being configured to receive the first and third optical signals from the optical link and supply the first optical signal at the first output and the third optical signal at the second output.

* * * * *